United States Patent
Ogihara et al.

(10) Patent No.: US 7,678,529 B2
(45) Date of Patent: Mar. 16, 2010

(54) SILICON-CONTAINING FILM FORMING COMPOSITION, SILICON-CONTAINING FILM SERVING AS ETCHING MASK, SUBSTRATE PROCESSING INTERMEDIATE, AND SUBSTRATE PROCESSING METHOD

(75) Inventors: Tsutomu Ogihara, Joetsu (JP); Takeshi Asano, Joetsu (JP); Motoaki Iwabuchi, Joetsu (JP); Takafumi Ueda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 402 days.

(21) Appl. No.: 11/594,176

(22) Filed: Nov. 8, 2006

(65) Prior Publication Data

US 2007/0117044 A1 May 24, 2007

(30) Foreign Application Priority Data

Nov. 21, 2005 (JP) ............... 2005-335261

(51) Int. Cl.
G03F 7/075 (2006.01)
G03F 7/11 (2006.01)
G03F 7/20 (2006.01)
G03F 7/30 (2006.01)
G03F 7/36 (2006.01)

(52) U.S. Cl. ............ 430/270.1; 430/313; 430/272.1; 430/280.1; 430/317; 430/323; 430/325; 430/326; 430/905; 430/907; 430/914; 430/919; 430/921

(58) Field of Classification Search ............ 430/270.1; 556/430; 522/83, 85, 86; 428/447, 72
See application file for complete search history.

(56) References Cited

U.S. PATENT DOCUMENTS

| | | | |
|---|---|---|---|
| 4,667,046 A * | 5/1987 | Frey et al. .......... 556/430 |
| 4,820,788 A | 4/1989 | Zeigler | |
| 5,232,812 A * | 8/1993 | Morrison et al. ....... 430/124.22 |
| 5,278,199 A * | 1/1994 | Ohkawa et al. ............ 522/95 |
| 5,385,804 A | 1/1995 | Premlatha et al. | |
| 5,632,910 A | 5/1997 | Nagayama et al. | |
| 6,025,117 A | 2/2000 | Nakano et al. | |
| 6,280,898 B1 | 8/2001 | Hasegawa et al. | |
| 6,329,125 B2 | 12/2001 | Takechi et al. | |
| 6,503,692 B2 | 1/2003 | Angelopoulos et al. | |
| 6,703,183 B2 | 3/2004 | Nishi et al. | |
| 7,217,496 B2 * | 5/2007 | Khojasteh et al. ....... 430/270.1 |
| 7,399,715 B2 * | 7/2008 | Tsuchiya et al. ........... 438/781 |
| 2004/0247900 A1 | 12/2004 | Ogihara et al. | |
| 2004/0253461 A1 | 12/2004 | Ogihara et al. | |
| 2005/0016499 A1 | 1/2005 | Noda et al. | |
| 2005/0074689 A1 * | 4/2005 | Angelopoulos et al. .. 430/270.1 |
| 2005/0239953 A1 * | 10/2005 | Sakurai et al. ............ 524/588 |
| 2006/0019195 A1 | 1/2006 | Hatakeyama et al. | |
| 2006/0105267 A1 * | 5/2006 | Khojasteh et al. ....... 430/270.1 |
| 2007/0117252 A1 * | 5/2007 | Ogihara et al. ............ 438/72 |

FOREIGN PATENT DOCUMENTS

| | | |
|---|---|---|
| EP | 0 336 404 A2 | 10/1989 |
| JP | 5-291208 A | 11/1993 |
| JP | 6-95385 A | 4/1994 |
| JP | 7-181688 A | 7/1995 |
| JP | 7-183194 A | 7/1995 |
| JP | 8/12626 A | 1/1996 |
| JP | 9-73173 A | 3/1997 |
| JP | 11-60735 A | 3/1999 |
| JP | 2000-159758 A | 6/2000 |
| JP | 2003-84438 A | 3/2003 |
| JP | 2003-140352 A | 5/2003 |
| JP | 5-310942 A | 11/2003 |
| JP | 2004-153125 A | 5/2004 |
| JP | 2004-349572 A | 12/2004 |
| JP | 2005-15779 A | 1/2005 |
| JP | 2005-48152 A | 2/2005 |
| JP | 2005-128509 A | 5/2005 |
| JP | 2005-146252 A | 6/2005 |
| JP | 2005-520354 A | 7/2005 |
| WO | WO-91-13002 A1 | 9/1991 |
| WO | WO-00/01684 A1 | 1/2000 |

OTHER PUBLICATIONS

Wilkinson et al. (eds), Comprehensive Organometallic Chemistry, vol. 2, 389 (1982).
Ito et al., Polym. Mater. Sci. Eng.. 1997, 77, pp. 449.
Meador et al., "New Materials for 193-nm Trilayer Imaging", Advances in Resist Technology and Processing XXI, Proceedings of SPIE, vol. 5376, SPIE, Bellingham, WA, 2004, pp. 1138-1148.

* cited by examiner

Primary Examiner—Sin J. Lee
(74) Attorney, Agent, or Firm—Birch, Stewart, Kolasch & Birch, LLP

(57) ABSTRACT

A multilayer resist process comprises forming in sequence an undercoat film, an intermediate film, and a photoresist film on a patternable substrate, and effecting etching in multiple stages. A silicon-containing film forming composition is useful in forming the intermediate film serving as an etching mask, comprising a silicon-containing polymer obtained through hydrolytic condensation of at least one Si—Si bond-containing silane compound having formula: $R_{(6-m)}Si_2X_m$ wherein R is a monovalent hydrocarbon group, X is alkoxy, alkanoyloxy or halogen, and m is 3 to 6. The composition allows the overlying photoresist film to be patterned to a satisfactory profile and has a high etching selectivity relative to organic materials.

30 Claims, No Drawings

SILICON-CONTAINING FILM FORMING COMPOSITION, SILICON-CONTAINING FILM SERVING AS ETCHING MASK, SUBSTRATE PROCESSING INTERMEDIATE, AND SUBSTRATE PROCESSING METHOD

CROSS-REFERENCE TO RELATED APPLICATION

This non-provisional application claims priority under 35 U.S.C. §119(a) on patent application No. 2005-335261 filed in Japan on Nov. 21, 2005, the entire contents of which are hereby incorporated by reference.

TECHNICAL FIELD

This invention relates to a silicon-containing film forming composition suitable for forming a silicon-containing film serving as an intermediate layer in a multilayer resist process employed for micropatterning in the semiconductor device manufacture technology; a silicon-containing film; and a substrate processing method using the same.

BACKGROUND ART

In the drive for higher integration and operating speeds in LSI devices, the pattern rule is made drastically finer. The lithography technology has achieved formation of finer patterns by a reduction of light source wavelength and a proper choice of a resist composition compliant therewith. The mainstream resides in positive photoresist compositions which are used as a single layer. The single layer positive photoresist composition contains a base resin with a skeleton having resistance to etching with chlorine or fluorine base gas plasma and is provided with such a resist mechanism that exposed areas are dissolved in developer. Briefly stated, the photoresist composition is coated on a patternable substrate, a pattern is formed by dissolving away the exposed areas, and the substrate is then etched with the remaining resist pattern serving as an etching mask.

Regrettably, in an attempt to achieve miniaturization, i.e., to reduce the pattern width, with the thickness of the photoresist film kept unchanged, the photoresist film is reduced in resolution performance. In the subsequent development of the photoresist film with a liquid developer for patterning, the so-called aspect ratio becomes too high, resulting in pattern collapse. Thus, the thickness of photoresist film must be reduced before miniaturization can be accomplished.

On the other hand, the process of processing a patternable substrate is generally by dry etching of the substrate with a patterned photoresist film serving as an etching mask. However, since no etching technique capable of establishing full etching selectivity between the photoresist film and the patternable substrate is currently available, the resist film can be damaged during the processing of the substrate. That is, the resist film can be broken up during the processing of the substrate, prohibiting the faithful transfer of the resist pattern to the patternable substrate. Then, as the pattern feature size becomes finer, the resist material is required to have higher etching resistance.

As a result of reduction of the exposure wavelength, on the other hand, the resin used in photoresist compositions is required to have low light absorption at the exposure wavelength. In accordance with a transition from i-line to KrF and to ArF, the resin also encountered a transition from novolac resins to polyhydroxystyrene and to aliphatic polycyclic skeleton resins. Actually, the etching rate of resin under the above-mentioned etching conditions has accordingly become higher, indicating the tendency that current photoresist compositions with higher resolution rather exhibit lower etching resistance.

This results in the situation that a patternable substrate has to be etched using a thinner, less etching resistant photoresist film. There exists an urgent demand for a material and process capable of accommodating this processing step.

One approach for solving these problems is the multilayer resist process. The process involves interleaving an intermediate film having different etching selectivity from a photoresist film, i.e., an overcoat resist film, between the overcoat resist film and a patternable substrate, processing the overcoat resist film to form a pattern, dry etching the intermediate film using the overcoat resist pattern as an etching mask, thereby transferring the pattern to the intermediate film, and dry etching the patternable substrate using the intermediate film as an etching mask, thereby transferring the pattern to the substrate.

The bilayer resist process falling within the category of the multilayer resist process uses a silicon-containing resin as the overcoat resist material and a novolac resin as the intermediate film, for example, as disclosed in JP-A 6-95385. The silicon-containing resin exhibits good etching resistance to reactive etching with oxygen plasma, but is readily etched away if fluorine gas plasma is used. In turn, the novolac resin is readily etched away by reactive etching with oxygen gas plasma, but exhibits good etching resistance to etching with fluorine or chlorine gas plasma. Then, a novolac resin film is formed on a patternable substrate as the intermediate film, and a silicon-containing resin is used to form an overcoat resist film thereon. A pattern is then formed in the silicon-containing resist film by irradiation of energy radiation and post-treatment such as development. Using the patterned resist film as an etching mask, reactive etching with oxygen plasma is carried out to etch away those portions of the novolac resin where the resist has been removed in pattern, thereby transferring the pattern to the novolac film. Using the pattern transferred to the novolac film as an etching mask, the patternable substrate is dry etched with a fluorine or chlorine gas plasma for transferring the pattern to the substrate.

In the dry etching, a transferred pattern is obtained in a relatively satisfactory shape as long as the etching mask has sufficient etching resistance. Since such a problem as pattern collapse caused by friction by a developer during resist development is unlikely to occur, a pattern having a relatively high aspect ratio is obtainable. As a consequence, if the thickness of a resist film using novolac resin corresponds to the thickness of the intermediate film, even in the case of a micropattern which could not otherwise be directly formed due to pattern collapse during development because of the problem of its aspect ratio, the bilayer resist process ensures formation of a novolac resin pattern having a sufficient thickness to serve as an etching mask for the patternable substrate.

Also included in the multilayer resist process is the trilayer resist process which can be implemented using conventional resist compositions as used in the single layer resist process. In this process, an organic film of novolac resin or the like is formed on a patternable substrate as an undercoat resist film, a silicon-containing film such as spin-on-glass (SOG) is formed thereon as an intermediate film, and a conventional organic resist film is further formed thereon as an overcoat resist film. With respect to dry etching with fluorine gas plasma, the organic resist overcoat film provides a definite etching selectivity relative to the SOG. Then the resist pattern is transferred to the SOG film by dry etching with fluorine gas plasma. With this process, even when a resist composition which is difficult to form a pattern having a sufficient thickness to allow a patternable substrate to be directly processed therethrough, or a resist composition having insufficient etching resistance to allow a substrate to be processed therethrough is used, a pattern of novolac film having sufficient etching resistance for processing is obtainable like the bilayer resist process as long as the pattern can be transferred to the SOG film.

As discussed above, the trilayer resist process uses a silicon-containing film as the intermediate film. Exemplary of the intermediate film used are silicon-containing inorganic films by CVD, for example, $SiO_2$ film (as disclosed in JP-A 7-183194) and SiON film (as disclosed in JP-A 7-181688), and films by spin-on deposition, for example, SOG film (as disclosed in JP-A 5-291208) and crosslinkable silsesquioxane film (as disclosed in JP-A 2005-520354). Additionally, a polysilane film (as disclosed in JP-A 11-60735) would be useful. Of these, the $SiO_2$ and SiON films perform well as etching mask when underlying organic films are dry etched, but require special equipment for their deposition. In contrast, the SOG, crosslinkable silsesquioxane and polysilane films can be formed merely by spin coating and heating, offering a high process efficiency.

The applicable range of the multilayer resist process is not limited to the attempt of increasing the resolution limit of resist films. If an attempt is made to form a pattern using a single resist film in the situation where a patternable intermediate substrate has substantial steps as in the via-first process which is one of substrate working processes, a problem arises that precise focusing is impossible during resist exposure because of substantial differences in resist film thickness. In such a case, planarization is achieved by burying steps in a sacrificial coating, after which a resist film is formed thereon, and a pattern is formed in the resist. This inevitably poses the use of a multilayer resist process as mentioned above. See JP-A 2004-349572.

In implementing the trilayer resist process, the efficiency of the process can be increased by using as the intermediate film a silicon-containing film which can be formed by spin coating. Nevertheless, the silicon-containing films used in the art suffer from several problems.

For example, it is well known that when a resist pattern is formed by photolithography, exposure light is reflected by the substrate and the reflected light interferes with the incident light to give rise to the problem of standing waves. To form a fine pattern without edge roughness from a resist film, an antireflective coating must be added as an intermediate film. For the trilayer resist process, this means that an organic antireflective coating must be disposed between an overcoat resist film and a silicon-containing intermediate film. If such an organic antireflective coating is added, there is a need that the relevant coating be patterned using the overcoat resist film as an etching mask. During the dry etching, an additional load is imposed on the overcoat resist film. One approach used in the art in order to eliminate such load is to provide the silicon-containing intermediate film with a light-absorbing structure such as an aromatic structure (as disclosed in JP-A 2005-15779).

However, anthracene and analogous organic structures capable of efficient light absorption function to reduce the rate of dry etching with fluorine gas plasma, pointing away from the dry etching of a silicon-containing film without imposing any additional load to the resist film. It is undesirable to incorporate substantial amounts of such substituent groups.

While oxygen gas plasma is often used in processing the undercoat resist film using the silicon-containing intermediate film as an etching mask, the etching rate of the intermediate film in reactive etching with the oxygen gas plasma is preferably lower in order to increase the etching selectivity ratio between the intermediate film and the undercoat film. To this end, the intermediate film desirably has as high a silicon content as possible. However, in the design of providing a light-absorbing function skeleton to side chains, the side chains occupy a higher proportion at the expense of a silicon content.

It is disclosed in JP-A 2003-140352 that polysilanes can have a relatively high silicon content and become appropriate antireflective coating materials. As opposed to the silicon-oxygen-silicon bond which remains transparent down to light of considerably shorter wavelength, the silicon-silicon bond absorbs light of longer wavelength and is deemed desirable as the silicon-containing intermediate film having an antireflective function. However, under halogen etching conditions, the polysilanes underwent cleavage of silicon-silicon bonds in their backbone and converted to low molecular weight components. A phenomenon that film strength diminished and the etched pattern collapsed was observed.

DISCLOSURE OF THE INVENTION

An object of the present invention is to provide a composition for forming a silicon-containing film serving as an etching mask, which can form a film by spin coating, which allows for satisfactory pattern formation when a resist film is formed thereon and the resist film is patterned, and which has a relatively high silicon content sufficient to acquire an etching selectivity relative to an organic film; a silicon-containing film serving as an etching mask; a substrate processing intermediate comprising the same; and a substrate processing process using the same.

Polysilsesquioxanes having Si—Si bonds are disclosed in JP-A 5-310942. Although the mechanism is not disclosed in detail, the use of polysilsesquioxanes in photoresist compositions and photo-reactive materials is indicated. The inventors learned that these materials can constitute one solution to the outstanding problems when they are used as the etching mask function silicon-containing film in the trilayer resist process rather than the resist film itself. Continuing investigation, the inventors have found that a hydrolytic condensate of a hydrolyzable silane having the general formula (1) including polysilsesquioxanes, as described above, but having relatively small side chains, and especially a co-hydrolytic condensate of a hydrolyzable silane having the general formula (1) and a hydrolyzable silane having the general formula (2) is appropriate to solve the above problems. A film of the hydrolytic condensate can be processed under halogen etching conditions, without the etched pattern being collapsed, because albeit cleavage of some silicon-silicon bonds, there still remain a multiplicity of siloxane bonds which are very robust bonds, as compared with the prior art polysilane antireflective coatings. The present invention is predicated on this finding.

In connection with a multilayer resist process comprising the steps of forming in sequence an undercoat film, an intermediate silicon-containing film, and a photoresist film on a patternable substrate, and effecting etching in multiple stages, the invention provides a silicon-containing film forming composition for use in forming the intermediate silicon-containing film serving as an etching mask, comprising a silicon-containing polymer obtained through hydrolytic condensation of a hydrolyzable silane alone or a mixture thereof comprising at least one silicon-silicon bond-containing silane compound having the general formula (1):

$$R_{(6-m)}Si_2X_m \qquad (1)$$

wherein R is each independently a substituted or unsubstituted monovalent hydrocarbon group of 1 to 12 carbon atoms, X is each independently an alkoxy group, alkanoyloxy group or halogen atom, and m is a number from 3 to 6.

In a preferred embodiment, the silicon-containing polymer is obtained through hydrolytic condensation of a mixture of hydrolyzable silanes comprising the silane compound having the general formula (1) and a hydrolyzable silane compound having the general formula (2):

$$A_a SiB_{(4-a)} \qquad (2)$$

wherein A is each independently hydrogen or a substituted or unsubstituted monovalent hydrocarbon group of 1 to 12 carbon atoms, B is each independently an alkoxy group, alkanoyloxy group or halogen atom, and a is 0 or 1.

In one embodiment wherein the silicon-containing polymer is obtained through hydrolytic condensation of a silane mixture comprising a plurality of silane compounds having formula (1), it is preferred that the compound of formula (1) wherein m is equal to 4 or 3 be predominant, because polymers having improved coating characteristics and shelf stability are obtained. If a compound wherein m is 5 or 6 is predominant, hydrolytic condensation of such silane compounds produces a polymer having too much an amount of silanol left therein, which invites inconvenient problems during shelf storage, including declines of coating ability and shelf stability as demonstrated by formation of foreign matter due to recombination of silanol moieties and a thicker film from the aged coating solution.

In the embodiment wherein a silane mixture comprising a plurality of silane compounds having formula (1) is used, a polymer with better physical properties is obtained when the mixture contains the silane compound of formula (1) wherein m is 4 and the silane compound of formula (1) wherein m is 3 in a molar ratio between 3:7 and 7:3. The compound with m=4 is effective in imparting a polar effect to the surface of the intermediate film so as to prevent the overcoat resist film from collapsing and to enlarge the process window, although the effect also depends more or less on a choice of R. Outside the range, a more proportion of the compound with m=3 may increase oil repellency, which is inherent to silicone resins, and thus cause striation when the overcoat resist film is coated thereon. Also outside the range, too high a proportion of the compound with m=4 has the tendency that the polymer contains a more amount of residual silanol, as mentioned above, probably leading to a decline of shelf stability.

Silicon-containing polymers having a weight average molecular weight in excess of 20,000 tend to exacerbate coating ability and in some cases, may cause formation of foreign matter and coating specks. It is thus preferred to use a silicon-containing polymer having a weight average molecular weight of up to 20,000. If a polymer having a weight average molecular weight of up to 500 is present in an amount of more than 5% by weight of the entire silicon-containing polymer, substantial film slimming may occur during baking, resulting in a coating film lacking in-plane uniformity.

The intermediate film of silicon-containing polymer has greater resistance to oxygen reactive ion etching (RIE) of the substrate when the silane compounds are selected so that the silicon-containing polymer satisfies the relationship: $0.45 \leq L/(L+M+N) \leq 0.95$ wherein L is the number of Si—O bonds, M is the number of Si—Si bonds, and N is the number of Si—C bonds within the polymer.

The silicon content of the silicon-containing polymer is defined as follows. In the case of a hydrolyzable silicon-containing monomer of formula (1), complete hydrolysis in the presence of sufficient water proceeds according to the scheme below.

$$R_{(6-m)}Si_2X_m + (m/2)H_2O \rightarrow R_{(6-m)}Si_2O_{(m/2)}$$

Provided that Rw is the formula weight of R, the silicon-containing polymer has a silicon containing proportion $S_1$ (%) which is:

$$S_1 = [28.1 \times 2/\{Rw \times (6-m) + 28.1 \times 2 + 16 \times (m/2)\}] \times 100.$$

Similarly, in the case of a silicon-containing monomer of formula (2), the reaction is according to the scheme below.

$$A_a SiB_{(4-a)} + \{(4-a)/2\}H_2O \rightarrow A_a SiO_{\{(4-a)/2\}}$$

Provided that Aw is the formula weight of A, the silicon-containing polymer has a silicon containing proportion $S_2$ (%) which is:

$$S_2 = [28.1/\{Aw \times a + 28.1 + 16 \times (4-a)/2\}] \times 100.$$

From the molar ratios of the respective compounds, the silicon containing proportion of the overall polymer can be calculated. The silicon content (%) of a polymer is accordingly calculated as (silicon weight)/(polymer weight)×100. When the silicon-containing polymer has a silicon content of at least 30%, the resulting polymer composition can form a silicon-containing film which serves as an effective etching mask during etching of the undercoat film even when the silicon-containing film has a thickness less than or equal to 100 nm. More preferably, when the silicon-containing polymer has a silicon content of at least 40%, the resulting polymer composition can form a silicon-containing film which serves as an effective etching mask during etching of the undercoat film even when the silicon-containing film has a thickness less than or equal to 50 nm.

In addition to the silicon-containing polymer, the composition may further comprise an acid generator and a crosslinker. These components are dissolved in an organic solvent to formulate the coating composition.

In another aspect, the invention provides a silicon-containing film serving as an etching mask. Using the above-described composition, the silicon-containing film is formed on an organic film (or undercoat film) coated on a patternable substrate. At the time when the silicon-containing film is formed from the composition, preferably the silicon-containing polymer is crosslinked so that the polymer is insolubilized with respect to an organic solvent.

In order that the silicon-containing film serve as an etching mask, a photoresist film is formed on the silicon-containing film to construct a substrate intermediate, with or without another film interposed between the silicon-containing film and the photoresist film. Alternatively, a substrate processing intermediate is defined as comprising in sequence: a patternable substrate, an undercoat film, a silicon-containing film as set forth above, and a photoresist film.

The invention is effective in the lithography using ArF excimer laser light where a single layer resist film is insufficiently resistant to etching. Particularly when a high resolution is requisite, the preferred resin of which the photoresist layer in the substrate processing intermediate is made is an alkali-soluble, poly(meth)acrylic acid-derived resin which has been alkali-insolubilized by protecting with acid labile groups. Also preferably, the photoresist film comprises a polymer with a side chain having an alcoholic functional group which exhibits acidity by fluorine substitution on the adjacent carbon.

In a further aspect of the invention, a pattern transfer process using the substrate processing intermediate involves the steps of providing a substrate processing intermediate as mentioned above; processing the substrate processing intermediate to form a resist pattern; etching the silicon-containing film with the resist pattern serving as an etching mask; then etching the organic film with the patterned silicon-containing film serving as an etching mask; and etching the substrate with the patterned organic film serving as an etching mask. Preferably the step of forming a resist pattern relies on photolithography using ArF excimer laser radiation.

It is known from Comprehensive Organometallic Chemistry, Vol. 2, 389 (1982) that Si—Si bonds have sufficient absorption in proximity to the wavelength 193 nm of ArF excimer laser. If the photolithography using ArF excimer laser radiation is applied in the formation of a resist pattern as described above, the etching mask function silicon-containing film of the invention not only serves as an etching mask, but also exerts satisfactory antireflective effect.

BENEFITS OF THE INVENTION

The etching mask function silicon-containing film forming composition of the invention uses a material which is relatively easily obtainable through hydrolytic condensation of a hydrolyzable silane having the general formula (1), especially co-hydrolytic condensation of a hydrolyzable silane having the general formula (1) and a hydrolyzable silane having the general formula (2). When a resist film is formed on a film of the composition and then patterned, the composition allows for satisfactory pattern formation. The composition offers a high etching selectivity relative to organic materials. As the photoresist pattern formed is transferred, in sequence, to the silicon-containing intermediate film and then to the organic bottom film by dry etching, the pattern can be finally transferred to the patternable substrate at a high precision.

DESCRIPTION OF THE PREFERRED EMBODIMENT

The terms "a" and "an" herein do not denote a limitation of quantity, but rather denote the presence of at least one of the referenced item.

The polymer included in the etching mask function silicon-containing film forming composition of the invention is a siloxane polymer obtained through hydrolytic condensation of a hydrolyzable silane compound alone or a mixture thereof comprising at least one silane compound having the general formula (1).

$$R_{(6-m)}Si_2X_m \quad (1)$$

Herein R is each independently a substituted or unsubstituted monovalent hydrocarbon group of 1 to 12 carbon atoms, X is each independently an alkoxy group, alkanoyloxy group or halogen atom, and m is a number in the range: $3 \leq m \leq 6$.

In another embodiment, the polymer may be a silicon-containing polymer obtained through hydrolytic condensation of a mixture of hydrolyzable silanes comprising at least one silane compound having the above general formula (1) and at least one silane compound having the general formula (2).

$$A_aSiB_{(4-a)} \quad (2)$$

Herein A is each independently hydrogen or a substituted or unsubstituted monovalent hydrocarbon group of 1 to 12 carbon atoms, B is each independently an alkoxy group, alkanoyloxy group or halogen atom, and a is 0 or 1.

Although the proportion of the disilane compound of formula (1) and the monosilane compound of formula (2) used varies with the formula weights of R and A, it is preferably controlled so as to form a polymer with a silicon content of at least 30% by weight.

In the silane compound (1), suitable examples of R include alkyl groups such as methyl, ethyl, n-propyl, isopropyl, n-butyl, isobutyl, sec-butyl, tert-butyl, n-pentyl, 2-ethylbutyl, 3-ethylbutyl, 2,2-diethylpropyl, cyclopentyl, n-hexyl, and cyclohexyl; alkenyl groups such as vinyl and allyl; alkynyl groups such as ethynyl; aryl groups such as phenyl and tolyl; aralkyl groups such as benzyl; and other unsubstituted monovalent hydrocarbon groups. Inter alia, methyl, ethyl, n-propyl, isopropyl and vinyl are most preferred.

Also useful are substituted forms of the foregoing monovalent hydrocarbon groups in which one or more hydrogen atoms are substituted by functional groups. Suitable functional groups include hydroxyl, epoxy, oxetanyl, amino, methylamino and dimethylamino groups, and fluorine, chlorine, bromine and iodine atoms. Inter alia, hydroxyl and epoxy groups are most preferred.

Suitable examples of X include alkoxy groups such as methoxy, ethoxy, n-propoxy, isopropoxy, n-butoxy, isobutoxy, sec-butoxy, t-butoxy, n-pentoxy, 2-ethylbutoxy, 3-ethylbutoxy, 2,2-diethylpropoxy, cyclopentyloxy, n-hexyloxy, and cyclohexyloxy; alkanoyloxy groups such as formyl, acetyl, propionyl, butyryl, isobutyryl, valeryl, isovaleryl, pivaloyl, and cyclohexylcarbonyl; and halogen atoms such as fluorine, chlorine, bromine and iodine. Of these, preference is given to methoxy, ethoxy, n-propoxy, isopropoxy, acetyl groups, and chlorine atoms.

The silane compound of formula (1) tends to reduce a condensation ability as the number of X becomes smaller. If a condensation ability is low, it is sometimes unsuccessful to incorporate the silane compound of formula (1) into a polymer skeleton through co-hydrolysis thereof with the compound of formula (2). Then, when a plurality of compounds of formula (1) are used, it is preferred that a compound wherein m or the number of X is equal to or greater than 3 be predominant. If a compound wherein the number of X is equal to or greater than 5 is predominant, too much an amount of silanol may be left after the condensation, resulting in a silicon-containing polymer having low shelf stability. It is then preferred that the compound wherein the number of X is 3 or 4 be predominant. As used herein, the term "predominant" means that the relevant compound accounts for at least 40% by weight, especially at least 50% by weight of the entire silane compounds.

Furthermore, a condensate from a compound with m=3 is likely to have a propensity of oil repellence which is inherent to silicone resins and may sometimes repel an overcoat resist coating solution. In contrast, a condensate from a compound with m=4 has a propensity of leaving silanol. For use as a hard mask, a silicon-containing polymer having satisfactory physical properties is obtained when the ratio of the compound with m=4 to the compound with m=3 is between 0.3 and 0.7, and also depending on a choice of R and a choice and amount of the monomer of formula (2).

It is preferred that A and B in the silane compound (2) be selected from the selection ranges of R and X in the silane compound (1), respectively. If it is desired to introduce complex substituent groups into silane compounds, introducing such substituent groups into A may be advantageous from the standpoint of silane compound purification or the like.

Preferably A is an organic group having at least one of a carbon-oxygen single bond and a carbon-oxygen double bond. Preferred examples are given below. In the following formulae, (Si) is depicted for indicating the bond position with silicon.

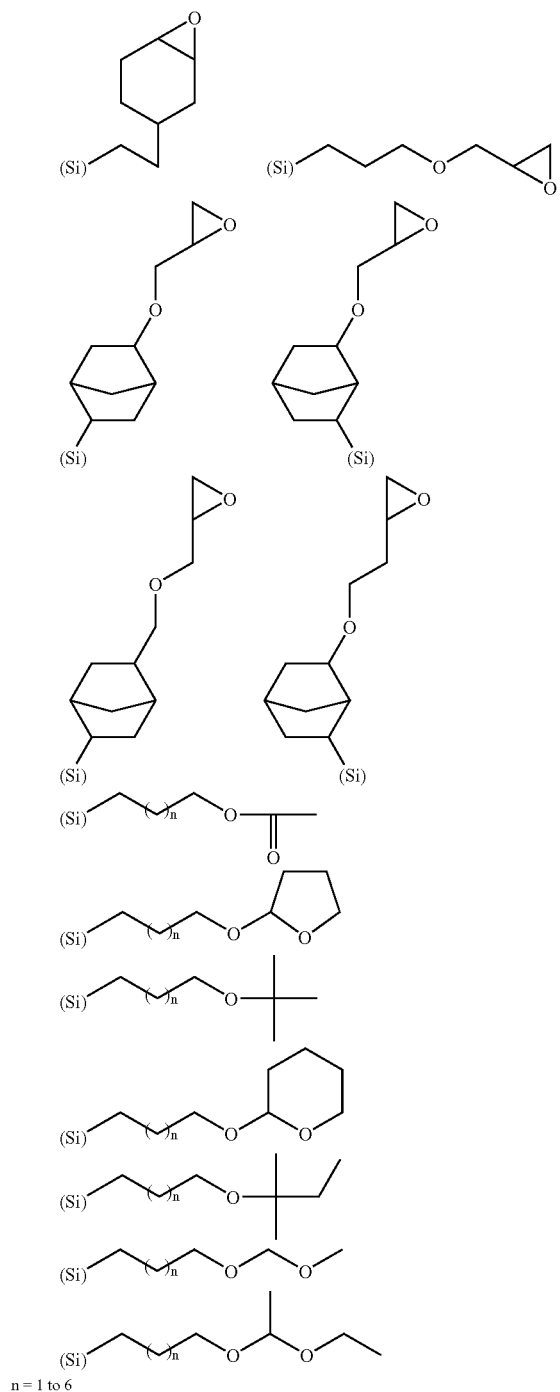

n = 1 to 6

In view of the overall polymer construction, oxygen RIE resistance becomes practically fully acceptable when the polymer satisfies the relationship: $0.45 \leq L/(L+M+N) \leq 0.95$ wherein L is the number of Si—O bonds, M is the number of Si—Si bonds, and N is the number of Si—C bonds within the polymer, though somewhat depending on a choice of R and A as organic side chains. If $L/(L+M+N)<0.45$, there are obtained no advantages because more Si—C and Si—Si bonds which are reactive to oxygen RIE are contained, resulting in not so high etching resistance despite a high silicon content. If $L/(L+M+N)>0.95$, on the other hand, the resulting silicon-containing polymer tends to have a large amount of silanol, sometimes losing shelf stability necessary to serve as a film-forming composition.

The selection of substituent groups and the mixing of a compound of formula (2) or another hydrolyzable silane compound are preferably controlled based on the silicon content of the polymer. The silicon-containing polymer should have a silicon content of at least 15%, calculated as (silicon weight)/(polymer weight)×100. Adjustment to a silicon content of at least 30% ensures that when the polymer film is used as an etching mask during processing of an undercoat film, the undercoat film can be processed at a polymer film thickness equal to or less than 100 nm. This enables to reduce the thickness of the overcoat resist film, that is, to process the substrate using a resist film with a thickness of about 150 to 250 nm. Further adjustment to a silicon content of at least 40% ensures that an undercoat film can be etched even when the thickness of the silicon-containing film is equal to or less than 50 nm, and in this case, the resist film may have a thickness of 100 to 200 nm.

In co-hydrolytic condensation of silane compounds to produce a siloxane polymer, the amount of water used is preferably 0.02 to 10 moles per mole of the monomers. A catalyst may be used to promote hydrolytic condensation. Suitable catalysts include acids such as formic acid, acetic acid, propionic acid, oleic acid, stearic acid, linoleic acid, salicylic acid, benzoic acid, oxalic acid, malonic acid, phthalic acid, fumaric acid, citric acid, tartaric acid, hydrochloric acid, sulfuric acid, nitric acid, sulfonic acid, methylsulfonic acid, tosylic acid, and trifluoromethanesulfonic acid; and metal chelates such as tetraalkoxytitanium, trialkoxymono(acetylacetonato)titanium, tetraalkoxyzirconium, trialkoxymono (acetylacetonato)zirconium, and aluminum triacetylacetonate.

In one reaction procedure, the monomer(s) is dissolved in an organic solvent, and water is added thereto whereupon hydrolytic reaction occurs. The catalyst may be added to the water or previously to the organic solvent. The reaction temperature is 0° C. to 100° C., preferably 10° C. to 80° C. The preferred procedure involves heating to 10 to 50° C. during dropwise addition of water, and thereafter, heating to 20 to 80° C. for the system to mature. Examples of suitable organic solvents used herein include methanol, ethanol, 1-propanol, 2-propanol, 1-butanol, 2-butanol, 2-methyl-1-propanol, acetone, tetrahydrofuran, toluene, hexane, ethyl acetate, cyclohexane, methyl-2-n-amylketone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures thereof.

Thereafter, the catalyst in the reaction solution is neutralized, and the organic solvent layer is separated and dehydrated. Thorough water removal is necessary because any residual water can induce condensation reaction of residual silanol. Water removal is preferably carried out by adsorption using salts such as magnesium sulfate or molecular sieves or by azeotropic water removal simultaneous with solvent removal.

In another reaction procedure, water and the catalyst are dissolved in an organic solvent, and the monomer(s) is added thereto. At this point, the monomer may have been diluted with the organic solvent. The reaction temperature is 0° C. to 100° C., preferably 10° C. to 80° C. The preferred procedure involves heating to 10 to 50° C. during dropwise addition of water, and thereafter, heating to 20 to 80° C. for the system to mature. The preferred organic solvents used herein are water-soluble solvents, for example, methanol, ethanol, 1-propanol, 2-propanol, 1-butanol, 2-butanol, 2-methyl-1-propanol, acetone, tetrahydrofuran, acetonitrile, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, and propylene glycol monopropyl ether, and mixtures thereof.

Thereafter, another organic solvent which is insoluble or substantially insoluble in water is added to the reaction solution, and the organic solvent layer is separated and washed with water for removing the catalyst used for hydrolytic condensation. At this point, neutralization may be done, if necessary. Subsequently, the organic solvent layer separated is dehydrated. Thorough water removal is necessary because any residual water can induce condensation reaction of residual silanol. Water removal is preferably carried out by adsorption using salts such as magnesium sulfate or molecular sieves or by azeotropic water removal simultaneous with solvent removal.

The molecular weight of the resulting silicon-containing polymer can be adjusted by a choice of the monomer(s) and by controlling reaction conditions during polymerization. The polymer preferably has a weight average molecular weight (Mw) of up to 20,000 because a polymer with a Mw in excess of 20,000 may sometimes cause generation of foreign particles or coating flecks. With respect to the molecular weight distribution, if a silicon-containing polymer product contains more than 5% by weight of a polymer fraction with a Mw of up to 500 based on the entire polymer product, that fraction will volatilize off during baking before it undergoes crosslinking reaction, exacerbating the in-plane uniformity of the coated film. It is thus recommended to use a polymer product containing not more than 5% by weight of a polymer fraction with a Mw of up to 500. It is noted that weight average molecular weight data are determined by gel permeation chromatography (GPC) with an RI detector and using polystyrene as the standard, with the molecular weight being expressed on the basis of polystyrene.

In the composition comprising the silicon-containing polymer according to the invention, modifiers and organic solvents may be incorporated. Suitable modifiers which can be used herein include acid generators, crosslinkers, surfactants, stabilizers, and the like.

Acid generators may be added for promoting thermally induced crosslinking reaction. The acid generators include thermal acid generators capable of generating an acid through pyrolysis and photoacid generators capable of generating an acid upon exposure to light, and both are useful.

The acid generators used herein include (i) onium salts of the formula (P1a-1), (P1a-2), (P1a-3) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and (ix) sulfonate derivatives.

These acid generators are described in detail.

(i) Onium Salts of Formula (P1a-1), (P1a-2) or (P1a-3):

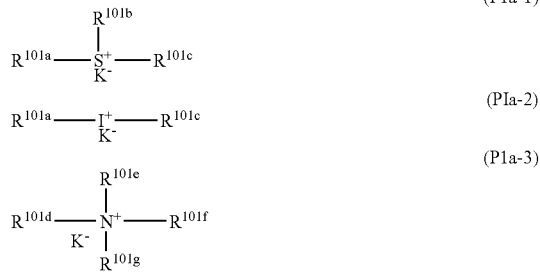

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by K⁻ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

The salts of (P1a-1) and (P1a-2) have both the functions of a photoacid generator and a thermal acid generator while the salts of (P1a-3) function as a thermal acid generator.

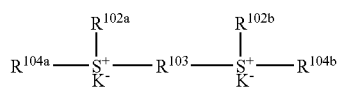

(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. K⁻ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by K⁻ are the same as exemplified for formulae (P1a-1), (P1a-2) and (P1a-3).

(ii) Diazomethane Derivatives of Formula (P2)

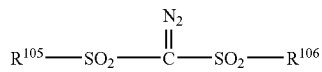

(P2)

Herein, $R^{105}$ and $R^{106}$ independently represent straight, branched or cyclic alkyl or halogenated alkyl groups of 1 to 12 carbon atoms, substituted or unsubstituted aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

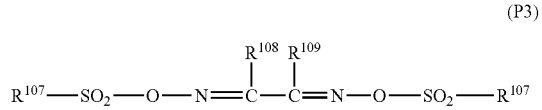

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

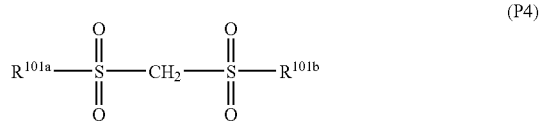

(P4)

Herein, $R^{101a}$ and $R^{101b}$ are as defined above.

(v) SULFONIC Acid Esters of N-Hydroxyimide Compounds of Formula (P5)

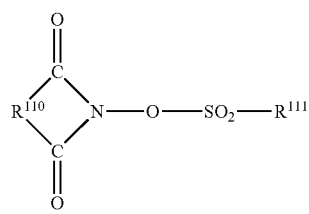

(P5)

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), heteroaromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
tetra-n-butylammonium nonafluorobutanesulfonate,
tetraphenylammonium nonafluorobutanesulfonate,
tetramethylammonium p-toluenesulfonate,
(p-methoxybenzyl)dimethylphenylammonium trifluoromethanesulfonate,
(p-methoxybenzyl)trimethylammonium trifluoromethanesulfonate,
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate], and 1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfonic acid derivatives such as
2-cyclohexylcarbonyl-2-(p-toluenesulfonyl)propane and
2-isopropylcarbonyl-2-(p-toluenesulfonyl)propane;
disulfone derivatives such as diphenyl disulfone and dicyclohexyl disulfone;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethanesulfonate,
(2-norbornyl)methyl(2-oxocylohexyl)sulfonium trifluoromethanesulfonate, and
1,2'-naphthylcarbonylmethyltetrahydrothiophenium triflate;

diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;

glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. The acid generator is preferably added in an amount of 0.01 to 50 parts by weight, and especially 0.1 to 40 parts by weight, per 100 parts by weight of the base polymer. The addition of the acid generator establishes a certain crosslinking density, which is advantageous because sufficient bonds must be formed between siloxane polymers in order to prevent intermixing when a resist composition solution or any coating solution is coated following the film formation using the inventive composition.

A crosslinker can be used herein as one of the modifiers. The crosslinker is a compound capable of crosslinking with a polymer under the action of an acid. Suitable crosslinkers include melamine compounds, guanamine compounds, glycoluril compounds and urea compounds having substituted thereon at least one group selected from among methylol, alkoxymethyl and acyloxymethyl groups, epoxy compounds, thioepoxy compounds, isocyanate compounds, azide compounds, and compounds having a double bond such as an alkenyl ether group.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Where epoxy groups are included as the substituent groups on R or A, the addition of a compound having a hydroxyl group is effective for increasing reactivity with epoxy groups and improving crosslinking efficiency. Compounds having at least two hydroxyl groups in a molecule are more preferred. Examples include alcoholic group-containing compounds such as 4,8-bis(hydroxymethyl)tricyclo[5.2.1.0$^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxyl; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4"-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4",4"'-(1,2-ethanediylidene)tetrakisphenol, 4,4',4",4"'-(1,2-ethanediylidene)tetrakis[2-methylphenol], 2,2'-methylenebis[6-[(2-hydroxy-5-methylphenyl)methyl]-4-methylphenol], 4,4',4",4"'-(1,4-phenylenedimethylidyne) tetrakisphenol, 2,4,6-tris(4-hydroxyphenylmethyl)-1,3-benzenediol, 2,4',4"-methylidenetrisphenol, 4,4',4"'-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)methyl]-4-methylphenol, 2,2'-methylenebis[6-[(3,5-dimethyl-4-hydroxyphenyl)methyl]-4-methylphenol, 4,4',4",4"'-tetrakis[(1-methylethylidene)bis(1,4-cyclohexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

Where hydroxyl groups are included in R or A, the addition of a compound having an epoxy group is effective for increasing reactivity with hydroxyl groups and improving crosslinking efficiency. Compounds having at least two epoxy groups in a molecule are more preferred. Examples include tris(2,3-epoxypropyl)isocyanurate, trimethylolmethane triglycidyl ether, trimethylol propane triglycidyl ether, and triethylol ethane triglycidyl ether.

In the inventive composition, the crosslinker, which may be either a hydroxyl- or epoxy-containing compound, is preferably compounded in an amount of 0.1 to 50 parts by weight, more preferably 1 to 20 parts by weight per 100 parts by weight of the base polymer. Less than 0.1 pbw of the crosslinker may cause insufficient crosslinkage and undercure to the polymer, allowing for mixing with the overcoat resist film. More than 50 pbw of the crosslinker may degrade the antireflection effect or allow the crosslinked film to crack, and reduce the silicon content of the overall film, which thus has poor etching resistance.

If necessary, a surfactant may be incorporated as the modifier. The preferred surfactants are nonionic surfactants including perfluoroalkylpolyoxyethylene ethanols, fluorinated alkyl esters, perfluoroalkylamine oxides, perfluoroalkyl ethylene oxide adducts, and fluorinated organosiloxanes. They are commercially available under the trade name of Fluorad FC-430, FC-431 and FC-4430 (Sumitomo 3M Co., Ltd.), Surflon S-141, S-145, KH-10, KH-20, KH-30 and KH-40 (Asahi Glass Co., Ltd.), Unidyne DS-401, DS-403 and DS-451 (Daikin Industry Co., Ltd.), Megaface F-8151 (Dainippon Ink & Chemicals, Inc.), X-70-092 and X-70-093 (Shin-Etsu Chemical Co., Ltd.). Inter alia, Fluorad FC-4430, KH-20, KH-30, and X-70-093 are preferred.

If necessary, a stabilizer may also be incorporated as the modifier. The stabilizer is added for restraining the film of the composition from changing its thickness during shelf storage. Examples of suitable stabilizers include carboxylic acids and carboxylic acid anhydrides such as oxalic acid, malonic acid, malonic anhydride, maleic acid, maleic anhydride, fumaric acid, citraconic acid, glutaric acid, glutaric anhydride, and adipic acid.

It is also possible to add a solvent to the composition as the stabilizer, the solvent having a function of improving the stability of the composition. The solvent should have at least one ether bond, carbonyl bond and/or ester bond and at least one hydroxyl group in a molecule and be capable of dissolving the acid generator and other additives therein. Suitable organic solvents include 2-methoxyethanol, 2-ethoxyethanol, 2-propoxyethanol, 2-isopropoxyethanol, 2-butoxyethanol, 2-(cyclohexyloxy)ethanol, propylene glycol butyl ether, 1-tert-butyl-2-propanol, 3-ethoxy-1-propanol, propylene glycol propyl ether, di(propylene glycol)-tert-butyl ether, 3-methoxy-1-butanol, 3-methoxy-3-methyl-1-butanol, 1-methoxy-2-propanol, 3-methoxy-1,2-propane diol, 3-ethoxy-1,2-propane diol, 3-allyloxy-1,2-propane diol, di(ethylene glycol), di(propylene glycol), di(ethylene glycol) monomethyl ether, di(ethylene glycol) monoethyl ether, di(ethylene glycol) monobutyl ether, di(ethylene glycol) monopropyl ether, di(propylene glycol) monomethyl ether, di(propylene glycol) monoethyl ether, di(propylene glycol) monobutyl ether, di(propylene glycol) monopropyl ether, ethylene glycol monoacetate, methyl glycolate, ethyl glycolate, methyl lactate, ethyl lactate, propyl lactate, butyl lactate, isobutyl lactate, tert-butyl lactate, methyl 2-hydroxybutanoate, ethyl 2-hydroxybutanoate, propyl 2-hydroxybutanoate, butyl 2-hydroxybutanoate, isobutyl 2-hydroxybutanoate, tert-butyl 2-hydroxybutanoate, methyl 3-hydroxybutanoate, ethyl 3-hydroxybutanoate, propyl 3-hydroxybutanoate, butyl 3-hydroxybutanoate, isobutyl 3-hydroxybutanoate, tert-butyl 3-hydroxybutanoate, hydroxyacetone, 1-hydroxy-2-butanone, 3-hydroxy-2-butanone, 3-hydroxy-3-methyl-2-butanone, 4-hydroxy-3-methyl-2-butanone, 3-acetyl-1-propanol, and 4-hydroxy-4-methyl-2-pentanone. They may be used alone or in admixture of two or more.

In the composition of the invention, an organic solvent may be used. Any organic solvent is useful as long as the siloxane polymer according to the invention and modifiers are soluble therein. Suitable organic solvents include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. It is understood that the solvents listed above as the stabilizer may also be used as the solvent as long as the siloxane polymer according to the invention and modifiers are soluble therein.

Of the above organic solvents, preferred are diethylene glycol dimethyl ether, propylene glycol monomethyl ether, propylene glycol monoethyl ether, propylene glycol monopropyl ether, propylene glycol monomethyl ether acetate, butyl acetate, ethyl lactate, cyclohexanone, and γ-butyrolactone, and mixtures thereof.

The organic solvent is preferably added in an amount of about 400 to 10,000 parts by weight, especially about 500 to 5,000 parts by weight per 100 parts by weight of the base polymer.

Like photoresists, the silicon-containing film forming composition of the invention can be applied onto a patternable substrate by any desired technique such as spin coating, to form an etching mask function silicon-containing film thereon. After spin coating, the coating is desirably baked in order to evaporate off the solvent and to promote crosslinking reaction for preventing the film from mixing with the overlying resist film. The baking is preferably effected at a temperature of 50 to 400° C. for a time of 10 to 300 seconds.

In the practice of the invention, a silicon-containing film as mentioned above is formed on a pattern portion of a patternable substrate with an undercoat film interposed therebetween, and a photoresist film is formed on the silicon-containing film, giving a structure which is ready for pattern formation.

The pattern portion of a patternable substrate is a low-k dielectric film having a dielectric constant (k) of up to 3, a primarily processed low-k dielectric film, a nitrogen and/or oxygen-containing inorganic film, or a metal film.

In the multilayer resist process, a resist film is formed on the silicon-containing film of the invention. The resist film is not particularly limited, but is preferably formed of a resist composition adapted for ArF excimer laser lithography. In the lithography requiring a very high resolution, it is critical how to control standing waves resulting from reflection of exposure light. It is thus essential to use an antireflective coating beneath the resist layer. However, since the light absorbing function of an ordinary antireflective coating almost relies on aromatic groups, etching of such an antireflective coating poses a certain load to the resist film. In contrast, the trilayer resist process using the silicon-containing film of the invention eliminates the use of an antireflective coating or uses only a thinner antireflective coating than the ordinary because the silicon-containing film has strong light absorption near the wavelength 190 nm due to Si—Si bonds. For this reason, the silicon-containing film of the invention is advantageously used with the trilayer resist process using exposure light with a wavelength of up to 200 nm, such as ArF excimer laser, and also with the lithography using a resist having little allowance for etching resistance as described below.

Where the silicon-containing film of the invention is used in the exposure process with ArF excimer laser light, the overlying resist film may be any of ordinary ArF excimer laser lithography resist compositions. There are known a number of candidates for the ArF excimer laser lithography resist composition, including resist compositions of the positive working type primarily comprising a resin which becomes soluble in an alkaline aqueous solution as a result of decomposition of acid labile groups under the action of an acid, a photoacid generator, and a basic compound for controlling acid diffusion; and resist compositions of the negative working type primarily comprising a resin which becomes insoluble in an alkaline aqueous solution as a result of reaction with a crosslinker under the action of an acid, a photoacid generator, a crosslinker, and a basic compound for controlling acid diffusion. Properties of a resist composition differ depending on what type of resin is used. Well-known resins are generally classified into poly(meth)acrylic, cycloolefin/maleic anhydride (COMA) copolymer, COMA-(meth)acrylic hybrid, cycloolefin ring-opening metathesis polymers (ROMP), and polynorbornene systems. Of these, a resist composition comprising a poly(meth)acrylic resin has superior resolution to other resins because etching resistance is achieved by introducing an alicyclic skeleton into side chain.

There are known a number of ArF excimer laser lithography resist compositions comprising poly(meth)acrylic resins. For the positive type, a polymer is composed of a combination of units for providing the main function of etching resistance, units which turn to be alkali soluble as a result of decomposition under the action of an acid, and units for providing adhesion, or in some cases, a combination comprising one unit capable of providing two or more of the above-mentioned functions. As the unit which changes alkali solubility under the action of an acid, (meth)acrylic acid esters having an acid labile group with an adamantane skeleton (see JP-A 9-73173) and (meth)acrylic acid esters having an acid labile group with an norbornane or tetracyclododecane skeleton (see JP-A 2003-84438) are advantageously used because they provide high resolution and etching resistance. As the unit which ensures adhesion, (meth)acrylic acid esters having a norbornane side chain with a lactone ring (see WO 00/01684), (meth)acrylic acid esters having an oxanorbornane side chain (see JP-A 2000-159758), and (meth)acrylic acid esters having a hydroxyadamantyl side chain (see JP-A 8-12626) are advantageously used because they provide satisfactory etching resistance and high resolution. Further, a polymer comprising units having as a functional group an alcohol which exhibits acidity by fluorine substitution on the adjacent carbon (see Polym. Mater. Sci. Eng., 1997, 77, pp 449) draws attention as a resist polymer complying with the immersion lithography of the current great interest because the units impart anti-swelling physical properties and hence, high resolution to the polymer. However, a decline of etching resistance due to inclusion of fluorine within the polymer is a problem. The etching mask function silicon-containing film of the invention is advantageously used in combination with such an organic resist material which is relatively difficult to secure etching resistance.

In the ArF excimer laser lithography resist compositions comprising the above-described polymers, acid generators, basic compounds and other components are also included. The acid generators used herein may be substantially the same as those used in the silicon-containing film forming composition of the invention, with onium salts being especially preferred for sensitivity and resolution. Also a number of basic compounds are known, and a choice may be advantageously made among the basic compounds described in JP-A 2005-146252 (US 2005-016499, EP 200517784), for example.

After the etching mask function silicon-containing film is formed, a photoresist layer is formed thereon using a photoresist composition solution. Like the silicon-containing film, the photoresist composition solution is preferably applied by spin coating. Once the resist composition is spin coated, it is prebaked, preferably at 80 to 180° C. for 10 to 300 seconds. The coating is then exposed, followed by post-exposure bake (PEB) and development, yielding a resist pattern.

The etching mask function silicon-containing film is etched using a fluorocarbon gas, nitrogen gas, carbon dioxide gas or the like. With these gases, the etching mask function silicon-containing film is etched at so high an etching rate that the overlying resist film undergoes less slimming.

In the multilayer resist process using the silicon-containing film of the invention, an undercoat film is formed between the silicon-containing film and a patternable substrate. Where the undercoat film serves as a mask during etching of the patternable substrate, it is preferably of an organic material having an aromatic skeleton. Where the undercoat film is a sacrificial film, not only the organic material, but also a silicon-containing material having a silicon content of up to 15% by weight are useful.

In the multilayer resist process using an organic film as the undercoat film serving as an etching mask for the patternable substrate, once the pattern of the resist film is transferred to the silicon-containing film, the pattern as transferred is again transferred to the organic film. The organic film must be characterized in that it can be etched under the etching conditions to which the silicon-containing film is highly resistant and it has high etching resistance to the etching conditions under which the patternable substrate is etched.

The organic film serving as the undercoat film described above is known in the art as the undercoat or bottom film for the trilayer resist process and the undercoat or bottom film for the bilayer resist process using silicon resist composition. Specifically, a number of resins including 4,4'-(9H-fluoren-9-ylidene)bisphenol novolac resin (molecular weight 11,000) as described in JP-A 2005-128509 (U.S. 2006-0019195), and other novolac resins are known as the resist undercoat film material in the bi- and trilayer resist processes. Any of such known resins may be used. If it is desired to enhance heat resistance over that of ordinary novolac resins, it may be effective to incorporate a polycyclic skeleton like the 4,4'-(9H-fluoren-9-ylidene)bisphenol novolac resin or to select a polyimide resin (see JP-A 2004-153125).

Like the photoresist composition solution, the organic film can be formed on a substrate by using a solution of the organic film forming composition and a spin coating technique. Once the undercoat resist film is formed by spin coating, it is desirably baked for evaporating off the organic solvent. The baking is preferably at a temperature in the range of 80 to 300° C. for 10 to 300 seconds.

It is preferred that the undercoat film have a thickness of at least 10 nm, especially at least 50 nm, the silicon-containing film of the invention have a thickness of up to 200 nm, and the photoresist film have a thickness of up to 300 nm, although the thickness ranges are not critical.

The trilayer resist process using the etching mask function silicon-containing film of the invention is performed as follows. In the process, an organic layer is first formed on a patternable substrate by such a technique as spin coating. The organic layer is desired to have higher etching resistance since it will serve as a mask when the patternable substrate is later etched. The organic layer as spin coated is desirably crosslinked by heat or acid because it is also required to prevent the organic layer from mixing with any overlying layer, i.e., silicon-containing film. On the organic layer, the etching mask function silicon-containing film of the invention and a photoresist film are formed in sequence by the above-described techniques. The resist film is exposed imagewise by a standard method, using a light source corresponding to the type of resist film, for example, KrF excimer laser light, ArF excimer laser light, or $F_2$ laser light, heat treated under conditions compliant with the type of resist film, and then developed with a liquid developer. In this way, a resist pattern is obtained. Next, using the resist pattern as an etching mask, etching, for example, dry etching with a fluoride gas plasma, is performed under conditions under which the etching rate of the silicon-containing film is dominantly high relative to the organic material. When the above-described antireflective film and silicon oxide film are etched, a silicon oxide film pattern is obtained without substantial influence of pattern changes by side etching of the resist film. Next, on the substrate having the pattern of silicon-containing film to which the resist pattern has been transferred, dry etching, for example, reactive dry etching with an oxygen-containing gas plasma or reactive dry etching with a hydrogen and nitrogen-containing gas plasma, is performed under conditions under which the etching rate of the undercoat organic film is dominantly high relative to the silicon oxide. The undercoat organic film is etched in this way. Through this etching step, a pattern of the undercoat organic film is produced, and at the same time, the uppermost resist layer is lost in most cases. Finally, using the patterned undercoat organic film as an etching mask, the patternable substrate can be etched in precision, for example, by dry etching such as fluoride dry etching or chloride dry etching.

EXAMPLE

Synthesis Examples and Examples are given below together with Comparative Examples for further illustrating the invention although the invention is not limited thereby.

Synthesis Example 1

A 300-ml glass flask was charged with a mixture of 27 g of tetraethoxydimethyldisilane and 23 g of triethoxytrimethyldisilane and 10 g of ethanol. With stirring, 15 g of 0.5N hydrochloric acid aqueous solution was slowly added at room temperature. Agitation continued for a further 2 hours. After the complete consumption of monomers was ascertained by GC and GPC, 350 g of propylene glycol monomethyl ether (PGME) was added. The liquid mixture was subjected to solvent exchange under a reduced pressure while heating the liquid at 40° C. There was obtained a PGME solution of Polymer 1. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 1 are summarized in Table 1.

Synthesis Example 2

A 300-ml glass flask was charged with 27 g of tetraethoxydimethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N acetic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There was obtained an EL solution of Polymer 2. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 2 are summarized in Table 1.

Synthesis Example 3

A 300-ml glass flask was charged with 27 g of tetraethoxydimethyldisilane, 23 g of triethoxytrimethyldisilane, 14 g of methyltrimethoxysilane, 48 g of 2-(3,4-epoxycyclohexyl)ethyltrimethoxysilane, and 75 g of ethanol. With stirring, 50 g of 0.5N oxalic acid aqueous solution was slowly added at room temperature. Agitation continued for a further 2 hours. After the complete consumption of monomers was ascertained by GC and GPC, 600 g of γ-butyrolactone (GBL) was added. The liquid mixture was subjected to solvent exchange under a reduced pressure while heating the liquid at 40° C. There was obtained a GBL solution of Polymer 3. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 3 are summarized in Table 1.

Synthesis Example 4

A 300-ml glass flask was charged with 53 g of tetraethoxydimethyldisilane and 10 g of ethanol. With stirring, 15 g of 0.5N hydrochloric acid aqueous solution was slowly added at room temperature. Agitation continued for a further 2 hours. After the complete consumption of monomer was ascertained by GC and GPC, 350 g of propylene glycol monomethyl ether (PGME) was added. The liquid mixture was subjected to solvent exchange under a reduced pressure while heating the liquid at 40° C. There was obtained a PGME solution of Polymer 4. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 4 are summarized in Table 1.

Synthesis Examples 5 to 9

A 300-ml glass flask was charged with 12, 17, 27, 37 or 41 g of tetraethoxydimethyldisilane, 42, 35, 24, 14 or 9 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N oxalic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There were obtained EL solutions of Polymers 5 to 9. The yield of each polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymers 5 to 9 are summarized in Table 1.

Synthesis Example 10

A 300-ml glass flask was charged with 30 g of pentaethoxymethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 30 g of 0.5N acetic acid aqueous solution was slowly added at room temperature. Agitation continued for a further 2 hours. After the complete consumption of monomers was ascertained by GC and GPC, 350 g of ethyl lactate (EL) was added. The liquid mixture was subjected to solvent exchange under a reduced pressure while heating the liquid at 40° C. There was obtained an EL solution of Polymer 10. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 10 are summarized in Table 1.

Synthesis Example 11

A 300-ml glass flask was charged with 42 g of tetraethoxysilane, 4 g of trimethoxyphenylsilane, and 10 g of ethanol. With stirring, 25 g of 0.5N nitric acid aqueous solution was slowly added at room temperature. Agitation continued for a further 2 hours. After the complete consumption of monomers was ascertained by GC and GPC, 350 g of PGME was added. The liquid mixture was subjected to solvent exchange under a reduced pressure while heating the liquid at 40° C. There was obtained a PGME solution of Polymer 11. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 11 are summarized in Table 1.

Synthesis Example 12

A 300-ml glass flask was charged with 42 g of tetraethoxysilane, 13 g of 9-anthracenecarboxymethyltriethoxysilane, and 20 g of methanol. With stirring, 25 g of 0.5N hydrochloric acid aqueous solution was slowly added at room temperature. Agitation continued for a further 2 hours. After the complete consumption of monomers was ascertained by GC and GPC, 350 g of PGME was added. The liquid mixture was subjected to solvent exchange under a reduced pressure while heating the liquid at 40° C. There was obtained a PGME solution of Polymer 12. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 12 are summarized in Table 1.

Synthesis Example 13

A 300-ml glass flask was charged with 27 g of tetraethoxydimethyldisilane, 23 g of triethoxytrimethyldisilane, 21 g of tetraethoxysilane, 7 g of 2-(3,4-epoxycyclohexyl)ethyltrimethoxysilane, and 10 g of ethanol. With stirring, 60 g of 0.5N methanesulfonic acid aqueous solution was slowly added at room temperature. Agitation continued for a further 20 hours. After the complete consumption of monomers was ascertained by GC and GPC, the liquid mixture was heated at 40° C. under vacuum, thereby distilling off the solvent. 350 g of PGME was added to the resulting polymer (Polymer 13) for fully dissolving the polymer. The yield of the polymer was determined by taking a predetermined amount of the solution, drying it on a dryer at 150° C. for one hour, and measuring the residue after evaporation. The yield was 100%. This suggests that all the reactants charged in the reactor are converted into a polymer. Accordingly, the silicon content and L/(L+M+N) in the polymer were determined from the charge composition. Data of Polymer 13 are summarized in Table 1.

TABLE 1

| Polymer | Mw | Proportion of Mw < 500 (wt %) | Si content (wt %) | L/(L + M + N) | m = 3 | m = 4 | m = 5 |
|---|---|---|---|---|---|---|---|
| Polymer 1 | 3,200 | 1 | 46 | 0.50 | 5 | 5 | 0 |
| Polymer 2 | 2,100 | 2 | 42 | 0.62 | 5 | 5 | 0 |
| Polymer 3 | 2,500 | 2 | 32 | 0.64 | 5 | 5 | 0 |
| Polymer 4 | 3,000 | 1 | 48 | 0.57 | 0 | 10 | 0 |
| Polymer 5 | 2,600 | 1 | 42 | 0.58 | 2 | 8 | 0 |
| Polymer 6 | 2,600 | 2 | 42 | 0.59 | 3 | 7 | 0 |
| Polymer 7 | 2,600 | 1 | 42 | 0.62 | 5 | 5 | 0 |
| Polymer 8 | 2,600 | 1 | 42 | 0.64 | 7 | 3 | 0 |
| Polymer 9 | 2,600 | 2 | 42 | 0.65 | 8 | 2 | 0 |
| Polymer 10 | 2,650 | 2 | 43 | 0.67 | 5 | 0 | 5 |
| Polymer 11 | 800 | 15 | 42 | 0.98 | 0 | 0 | 0 |
| Polymer 12 | 2,000 | 2 | 31 | 0.97 | 0 | 0 | 0 |
| Polymer 13 | 21,000 | 0 | 42 | 0.62 | 5 | 5 | 0 |

Examples and Comparative Examples

Etching mask function silicon-containing film forming solutions were prepared by dissolving a resin (Polymers 1 to 13), an acid generator (AG1), and a crosslinker (CL1) in a solvent containing 0.1 wt % of Fluorad FC-430 (3M-Sumitomo Co., Ltd.) according to the formulation shown in Table 2, and passing through a fluoroplastic filter having a pore size of 0.1 μm. These solutions are designated Solutions #1 to #13.

Each of the silicon-containing film forming solutions was coated on a silicon substrate and baked at 250° C. for 60 seconds to form a silicon-containing film of 193 nm thick. The resulting films are designated Films #1 to #13. Using a variable angle spectroscopic ellipsometer (VASE®) of J. A. Woollam Co., the optical constants (refractive index n, extinction coefficient k) at wavelength 193 nm of Films #1 to #13 were determined. The results are also shown in Table 2.

TABLE 2

Composition and optical constants of silicon-containing film serving as etching mask

| No. | Polymer (pbw) | Acid generator (pbw) | Cross-linker (pbw) | Solvent (pbw) | Optical constants at wavelength 193 nm | |
|---|---|---|---|---|---|---|
| | | | | | n | k |
| Solution #1 | Polymer 1 (4.0) | AG1 (0.04) | — | PGME (100) | 1.68 | 0.20 |
| Solution #2 | Polymer 2 (4.0) | AG1 (0.04) | CL1 (0.1) | EL (100) | 1.67 | 0.21 |
| Solution #3 | Polymer 3 (4.0) | AG1 (0.04) | — | GBL (100) | 1.67 | 0.20 |
| Solution #4 | Polymer 4 (4.0) | AG1 (0.04) | — | PGME (100) | 1.68 | 0.20 |
| Solution #7 | Polymer 7 (4.0) | AG1 (0.04) | — | PGME (100) | 1.67 | 0.20 |
| Solution #10 | Polymer 10 (4.0) | AG1 (0.04) | CL1 (0.1) | PGME (100) | 1.67 | 0.19 |
| Solution #11 | Polymer 11 (4.0) | AG1 (0.04) | — | PGME (100) | 1.70 | 0.20 |
| Solution #12 | Polymer 12 (4.0) | AG1 (0.04) | — | PGME (100) | 1.75 | 0.25 |
| Solution #13 | Polymer 13 (4.0) | AG1 (0.04) | — | PGME (100) | 1.66 | 0.19 |

AG1: di(4-t-butylphenyl)iodonium perfluorobutanesulfonate
CL1: Celeoxide 2021 (Daicel Chemical Industries, Ltd.)
PGME: propylene glycol monomethyl ether
EL: ethyl lactate
GBL: γ-butyrolactone First, an undercoat-forming material, for example, a composition containing 28 parts by weight of a resin in the form of 4,4'-(9H-fluoren-9-ylidene)bisphenol novolac resin with a molecular weight of 11,000 and 100 parts by weight of a solvent (see JP-A 2005-128509) was spin coated onto a patternable substrate and baked at 200° C. for one minute to form an undercoat organic film of 300 nm thick. A number of resins including the above-specified resin and other novolac resins are known as the undercoat organic film material for the multilayer resist process, and any of them can be used herein.

Next, each of the silicon-containing intermediate film forming solutions (Solutions #1 to #13) was spin coated and baked at 250° C. for 60 seconds to form an intermediate layer of 100 nm thick.

Further, to form an overcoat resist film, a resist composition for ArF excimer laser lithography (designated Resist 1) was prepared by dissolving 10 parts by weight of a resin, identified below, 0.2 part by weight of triphenylsulfonium nonafluorobutanesulfonate as a photoacid generator and 0.02 part by weight of triethanolamine as a basic compound in propylene glycol monomethyl ether acetate (PGMEA) containing 0.1 wt % of Fluorad FC-430 (3M-Sumitomo Co., Ltd.) and passing through a fluoroplastic filter having a pore size of 0.1 μm.

Resin:

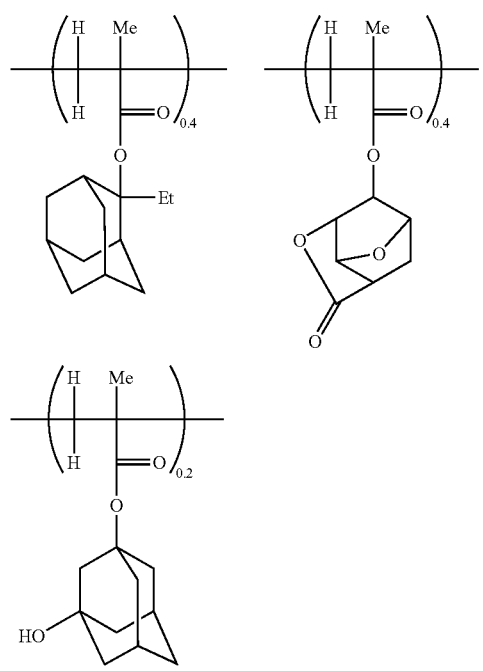

(Me = methyl, Et = ethyl)
Mw = 6,800

The resist composition was coated onto the intermediate layer and baked at 130° C. for 60 seconds to form a photoresist layer of 200 nm thick.

Thereafter, the resist layer was exposed using an ArF laser stepper S305B (Nikon Corporation, NA 0.68, σ 0.85, 2/3 annular illumination, Cr mask), then baked (PEB) at 110° C. for 90 seconds, and developed with a 2.38 wt % aqueous solution of tetramethylammonium hydroxide (TMAH), thereby giving a positive pattern. The shape of the 90 nm line-and-space pattern was observed, inspecting substrate-proximate footing, undercut and intermixing phenomena. The results are shown in Table 3.

TABLE 3

Results of resist exposure (pattern profile)

| Film | 90 nm L/S pattern profile |
|---|---|
| Film #1 | perpendicular, no footing |
| Film #2 | perpendicular, no footing |
| Film #3 | perpendicular, no footing |
| Film #4 | perpendicular, no footing |
| Film #5 | slightly tapered, footing |
| Film #6 | perpendicular, slight footing |
| Film #7 | perpendicular, no footing |
| Film #8 | perpendicular, slight footing |
| Film #9 | slightly reverse tapered, footing |
| Film #10 | perpendicular, footing |
| Film #11 | slightly reverse tapered, footing |
| Film #12 | pattern collapse due to reverse tapering |
| Film #13 | much scum between patterns |

Next, dry etching tests were conducted. There were prepared silicon-containing films (Films #1 to #13) as used for the measurement of optical constants. These films, undercoat films and photoresist films were examined by an etching test under etching conditions (1).

$CHF_3/CF_4$ Gas Etching Test

Instrument: dry etching instrument TE-8500P by Tokyo Electron K.K.

| Conditions (1): | |
|---|---|
| Chamber pressure | 40.0 Pa |
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 10 sec |

Next, the resist pattern obtained after the ArF exposure and development was transferred to the silicon-containing intermediate film by etching under the etching conditions (2).

| Conditions (2): | |
|---|---|
| Chamber pressure | 40.0 Pa |
| RF power | 1000 W |
| Gap | 9 mm |
| $CHF_3$ gas flow rate | 20 ml/min |
| $CF_4$ gas flow rate | 60 ml/min |
| Ar gas flow rate | 200 ml/min |
| Time | 30 sec |

Next, the pattern transferred to the intermediate film was transferred to the undercoat film by etching with oxygen base gas under the etching conditions (3).

| Conditions (3): | |
|---|---|
| Chamber pressure | 60.0 Pa |
| RF power | 600 W |
| Gap | 9 mm |
| Ar gas flow rate | 40 ml/min |
| $O_2$ gas flow rate | 60 ml/min |
| Time | 20 sec |

The intermediate layer film obtained according to the invention has sufficient resist compatibility to form a pattern profile with rectangularity. In the case of intermediate layer films using polymers of Comparative Examples, overcoat resist profiles are not satisfactory.

Next, the films were examined for a rate of dry etching with $CF_4/CHF_3$ gas as shown in Table 4. The etching rate of the intermediate layer film is fully high as compared with the undercoat film and the overcoat resist film, allowing for pattern transfer by etching through the overcoat film serving as mask. The intermediate film functions satisfactorily as a hard mask in etching of the undercoat film.

TABLE 4

$CHF_3/CF_4$ gas dry etching rate

| Etching mask function silicon-containing film or others | $CHF_3/CF_4$ gas etching rate (nm/min) |
|---|---|
| Film #1 | 288 |
| Film #2 | 222 |
| Film #3 | 264 |
| Film #4 | 300 |
| Film #11 | 281 |
| Film #12 | 201 |
| Resist 1 | 142 |
| Undercoat film | 100 |

Subsequently, the films were examined for a rate of dry etching with $O_2$ gas as shown in Table 5. The etching rate of the intermediate layer film is fully low as compared with the undercoat film and the overcoat resist film, allowing for pattern transfer to the undercoat film by etching through the intermediate layer serving as an etching mask.

TABLE 5

$O_2$ gas dry etching rate

| Etching mask function silicon-containing film or others | $O_2$ gas etching rate (nm/min) |
|---|---|
| Film #1 | 3 |
| Film #2 | 2 |
| Film #3 | 3 |
| Film #4 | 1 |
| Film #11 | 2 |
| Film #12 | 2 |
| Resist 1 | 300 |
| Undercoat film | 280 |

It was confirmed that the shape of the undercoat film to which the pattern had been transferred was satisfactory.

Furthermore, a shelf stability test was performed. The silicon-containing film forming compositions (Solutions #1-4, #10-12) prepared above were stored at 30° C. for one month, following which they were coated by the above-mentioned technique. It was examined whether any change of film formation occurred before and after the storage.

TABLE 6

Shelf stability test

| Composition | State as coated |
|---|---|
| Solution #1 | no striation, no thickness change |
| Solution #2 | no striation, no thickness change |
| Solution #3 | no striation, no thickness change |
| Solution #4 | striation, 5% thickness increase |
| Solution #10 | no striation, 3% thickness increase |

TABLE 6-continued

Shelf stability test

| Composition | State as coated |
|---|---|
| Solution #11 | striation, 5% thickness increase |
| Solution #12 | striation, 5% thickness increase |

The silicon-containing film serving as etching mask of the invention has a high etching selectivity ratio, i.e., a high etching speed, relative to the resist film. The silicon-containing film has an extinction coefficient sufficient to provide an antireflective effect and allows a resist film to be patterned into a resist profile of perpendicular shape without such drawbacks as reverse tapering and footing.

Japanese Patent Application No. 2005-335261 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicon-containing film forming composition used for multilayer resist process comprising the steps of forming in sequence an undercoat film, an intermediate silicon-containing film, and a photoresist film on a patternable substrate, and effecting etching in multiple stages, said silicon-containing film forming composition for use in forming the intermediate silicon-containing film serving as an etching mask, comprising a silicon-containing polymer, an acid generator, and a crosslinker, said silicon-containing polymer is obtained through hydrolytic condensation of a mixture of hydrolysable silanes comprising:

at least one silicon-silicon bond-containing silane compound having the general formula (1);

$$R_{(6-m)}Si_2X_m \quad (1)$$

wherein each R is independently a substituted or unsubstituted monovalent hydrocarbon group of 1 to 12 carbon atoms, each X is independently an alkoxy group, alkanoyloxy group or halogen atom, and m is a number from 3 to 6, and a hydrolysable silane compound having the general formula (2):

$$A_aSiB_{(4-a)} \quad (2)$$

wherein each A is independently hydrogen or a substituted or unsubstituted monovalent hydrocarbon group of 1 to 12 carbon atoms, each B is independently an alkoxy group, alkanoyloxy group or halogen atom, and a is 0 or 1, the compound of formula (1) wherein m is equal to 4 or 3 accounting for at least 40% by weight of the entire silane compounds, and the silane compound of formula (1) wherein m is 4 and the silane compound of formula (1) wherein m is 3 being in a molar ratio between 3:7 and 7:3.

2. The composition of claim 1, wherein the silicon-containing polymer has a weight average molecular weight of up to 20,000, with a polymer having a weight average molecular weight of up to 500 being present in an amount of up to 5% by weight of the entire silicon-containing polymer.

3. The composition of claim 1, wherein the silicon-containing polymer satisfies 0.45≦L/(L+M+N)≦0.95 wherein L is the number of Si—O bonds, M is the number of Si—Si bonds, and N is the number of Si—C bonds per polymer unit weight.

4. The composition of claim 1, wherein the silicon-containing polymer has a silicon content of at least 30%, calculated as (silicon weight)/(polymer weight)×100.

5. The composition of claim 4, wherein the silicon-containing polymer has a silicon content of at least 40%, calculated as (silicon weight)/(polymer weight)×100.

6. A silicon-containing film serving as an etching mask, said film being formed from the composition of claim 1.

7. A silicon-containing film serving as an etching mask, said film being formed from the composition of claim 1, wherein the silicon-containing polymer is crosslinked to restrain the polymer from being dissolved in an organic solvent.

8. The composition of claim 1, wherein A in formula (2) is one selected from the group consisting of the following formulae:

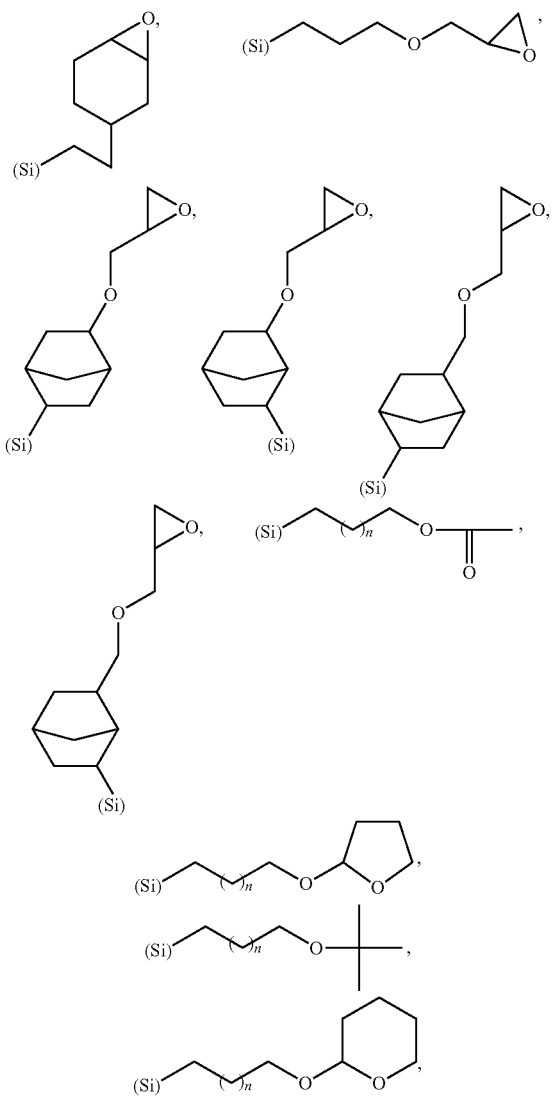

-continued

wherein (Si) is depicted for indicating the bond position with silicon, and n is 1 to 6.

9. The composition of claim 1, wherein the acid generator is at least one selected from the group consisting of onium salts, diazomethane derivatives, glyoxime derivatives, and sulfonic acid esters.

10. The composition of claim 1, wherein the crosslinker is at least one selected from the group consisting of melamine compounds, guanamine compounds, glycoluril compounds and urea compounds having substituted thereon at least one group selected from the group consisting of methylol, alkoxymethyl groups, acyloxymethyl groups, epoxy compounds, thioepoxy compounds, isocyanate compounds, azide compounds, and compounds having an alkenyl ether group.

11. The composition of claim 1, further comprising a stabilizer selected from the group consisting of carboxylic acids and carboxylic acid anhydrides.

12. The composition of claim 1, further comprising a solvent having at least one ether bond, carbonyl bond and/or ester bond as a stabilizer.

13. A silicon-containing film serving as an etching mask, said film being formed from a silicon-containing film forming composition used for a multilayer resist process comprising the steps of forming in sequence an undercoat film, an intermediate silicon-containing film, and a photoresist film on a patternable substrate and effecting etching in multiple stages,
said silicon-containing film forming composition for use in forming the intermediate silicon-containing film serving as an etching mask, comprising a silicon-containing polymer, an acid generator, and a crosslinker, said silicon-containing polymer is obtained through hydrolytic condensation of a mixture of hydrolysable silanes comprising:
at least one silicon-silicon bond-containing silane compound having the general formula (1):

$$R_{(6-m)}Si_2X_m \quad (1)$$

wherein each R is independently a substituted or unsubstituted monovalent hydrocarbon group of 1 to 12 carbon atoms, each X is independently an alkoxy group, alkanoyloxy group or halogen atom, and m is a number from 3 to 6, and
a hydrolysable silane compound having the general formula (2):

$$A_aSiB_{(4-a)} \quad (2)$$

wherein each A is independently hydrogen or a substituted or unsubstituted monovalent hydrocarbon group of 1 to 12 carbon atoms, each B is independently an alkoxy group, alkanoyloxy group or halogen atom, and a is 0 or 1, and
said silicon-containing film being formed between the undercoat film and the resist film on the patternable substrate, with or without another interleaf film.

14. The silicon-containing film of claim 13, wherein the silicon-containing polymer is obtained through hydrolytic condensation of a silane mixture comprising a plurality of silane compounds having the general formula (1), the compound of formula (1) wherein m is equal to 4 or 3 accounts for at least 40% by weight of the entire silane compounds.

15. The silicon-containing film of claim 14, wherein the mixture contains the silane compound of formula (1) wherein m is 4 and the silane compound of formula (1) wherein m is 3 in a molar ratio between 3:7 and 7:3.

16. The silicon-containing film of claim 13, wherein the silicon-containing polymer has a weight average molecular weight of up to 20,000, with a polymer having a weight average molecular weight of up to 500 being present in an amount of up to 5% by weight of the entire silicon-containing polymer.

17. The silicon-containing film of claim 13, wherein the silicon-containing polymer satisfies 0.45≦L/(L+M+M) <0.95 wherein L is the number of Si—O bonds, M is the number of Si—Si bonds, and N is the number of Si—C bonds per polymer unit weight.

18. The silicon-containing film of claim 13, wherein the silicon-containing polymer has a silicon content of at least 30%, calculated as (silicon weight)/(polymer weight)×100.

19. The silicon-containing film of claim 13, wherein A in formula (2) is one selected from the group consisting of the following formulae:

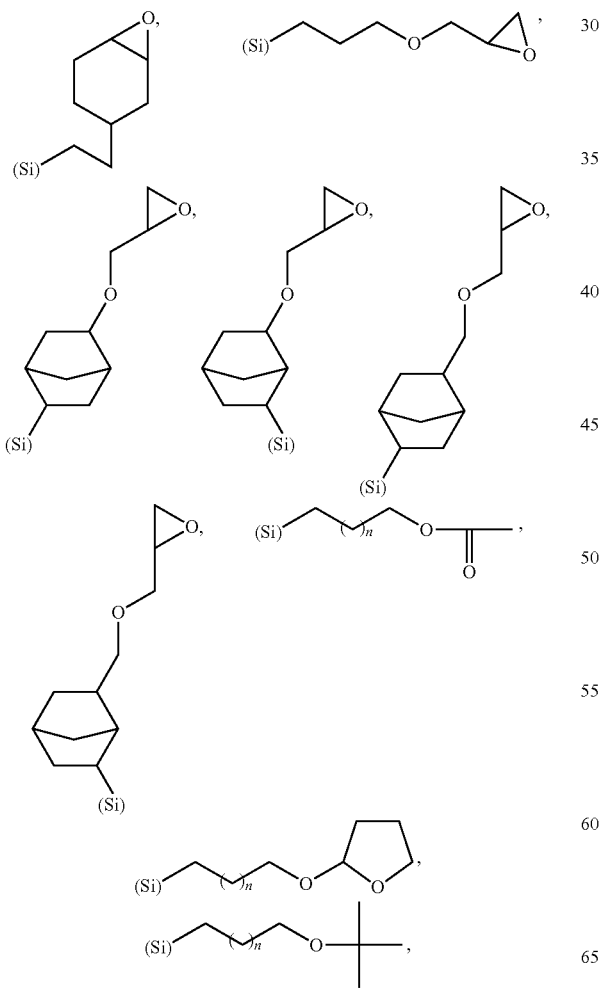

wherein (Si) is depicted for indicating the bond position with silicon, and n is 1 to 6.

20. A substrate process intermediate comprising in sequence: a patternable substrate, an undercoat film, a silicon-containing film, and a photoresist film,
said silicon-containing film being formed from a silicon-containing film forming composition used for a multilayer resist process comprising the steps of forming in sequence an undercoat film, an intermediate silicon-containing film, and a photoresist film on a patternable substrate, and effecting etching in multiple stages,
said silicon-containing film forming composition for use in forming the intermediate silicon-containing film serving as an etching mask, comprising a silicon-containing polymer, an acid generator, and a crosslinker, said silicon-containing polymer is obtained through hydrolytic condensation of a mixture of hydrolysable silanes comprising:
at least one silicon-silicon bond-containing silane compound having the general formula (1):

$$R_{(6-m)}Si_2X_m \qquad (1)$$

wherein each R is independently a substituted or unsubstituted monovalent hydrocarbon group of 1 to 12 carbon atoms, each X is independently an alkoxy group, alkanoyloxy group or halogen atom, and m is a number from 3 to 6, and
a hydrolysable silane compound having the general formula (2):

$$A_aSiB_{(4-a)} \qquad (2)$$

wherein each A is independently hydrogen or a substituted or unsubstituted monovalent hydrocarbon group of 1 to 12 carbon atoms, each B is independently an alkoxy group, alkanoyloxy group or halogen atom, and a is 0 or 1.

21. The substrate process intermediate of claim 20, wherein the photoresist film comprises an alkali-soluble resin derived from a poly(meth)acrylic acid which has been alkali-insolubilized by protecting with acid labile groups.

22. The substrate process intermediate of claim 20, wherein the photoresist film comprises a polymer with a side chain having an alcoholic functional group which exhibits acidity by fluorine substitution on the adjacent carbon.

23. A method of processing a patternable substrate, comprising the steps of
processing the substrate processing intermediate of claim 20, to form a resist pattern,
etching the silicon-containing film with the resist pattern serving as an etching mask, then etching the undercoat film with the patterned silicon-containing film serving as an etching mask, and etching the substrate with the patterned undercoat film serving as an etching mask.

24. The processing method of claim 23, wherein the step of forming a resist pattern relies on photolithography using ArF excimer laser radiation.

25. The substrate process intermediate of claim 20, wherein the silicon-containing polymer is obtained through hydrolytic condensation of a silane mixture comprising a plurality of silane compounds having the general formula (1), the compound of formula (1) wherein m is equal to 4 or 3 accounts for at least 40% by weight of the entire silane compounds.

26. The substrate process intermediate of claim 25, wherein the mixture contains the silane compound of formula (1) wherein m is 4 and the silane compound of formula (1) wherein m is 3 in a molar ratio between 3:7 and 7:3.

27. The substrate process intermediate of claim 20, wherein the silicon-containing polymer has a weight average molecular weight of up to 20,000, with a polymer having a weight average molecular weight of up to 500 being present in an amount of up to 5% by weight of the entire silicon-containing polymer.

28. The substrate process intermediate of claim 20, wherein the silicon-containing polymer satisfies $0.45 \leq L/(L+M+N) \leq 0.95$ wherein L is the number of Si—O bonds, M is the number of Si—Si bonds, and N is the number of Si—C bonds per polymer unit weight.

29. The substrate process intermediate of claim 20, wherein the silicon-containing polymer has a silicon content of at least 30%, calculated as (silicon weight)/(polymer weight)×100.

30. The substrate process intermediate of claim 20, wherein A in formula (2) is one selected from the group consisting of the following formulae:

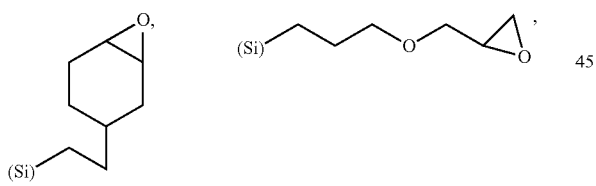

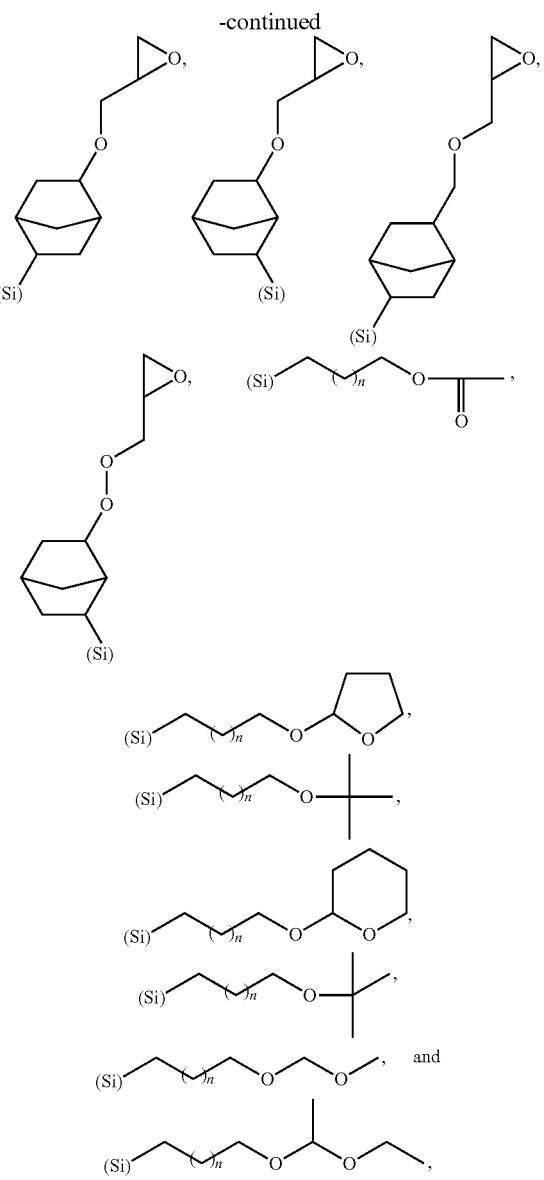

wherein (Si) is depicted for indicating the bond position with silicon and n is 1 to 6.

* * * * *